(12) United States Patent
Haraszti (10) Patent No.: US 11,037,069 B1
(45) Date of Patent: Jun. 15, 2021

(54) METHOD FOR CREATING GATES AND CIRCUITS FOR GREATLY IMPROVED COMPUTING APPARATUS BY USING SYMBOL TRANSFORMER

(71) Applicant: Tegze P. Haraszti, Newport Beach, CA (US)

(72) Inventor: Tegze P. Haraszti, Newport Beach, CA (US)

( * ) Notice: Subject to any disclaimer, the term of this patent is extended or adjusted under 35 U.S.C. 154(b) by 0 days.

(21) Appl. No.: 16/873,029

(22) Filed: Jan. 17, 2020

(51) Int. Cl.
*G06N 10/00* (2019.01)
*G06N 7/00* (2006.01)
*H03K 19/195* (2006.01)
*H03K 19/20* (2006.01)

(52) U.S. Cl.
CPC ............ *G06N 10/00* (2019.01); *G06N 7/005* (2013.01); *H03K 19/195* (2013.01); *H03K 19/20* (2013.01)

(58) Field of Classification Search
CPC ...... G06N 10/00; G06N 7/005; H03K 19/195; H03K 19/20
USPC ...................................... 326/38–41
See application file for complete search history.

(56) References Cited

U.S. PATENT DOCUMENTS

| | | | |
|---|---|---|---|
| 4,811,400 A | 7/1989 | Fisher | |
| 7,847,615 B2 | 12/2010 | Yorozu | |
| 2015/0123707 A1* | 5/2015 | Nicol | H03K 19/017581 326/41 |
| 2016/0065213 A1* | 3/2016 | Patil | H03K 19/017581 326/38 |
| 2016/0105186 A1* | 4/2016 | Sullam | H03K 19/1776 326/38 |
| 2016/0226492 A1* | 8/2016 | Rajput | G11C 19/28 |
| 2018/0275193 A1* | 9/2018 | Rouge | G01R 31/31727 |
| 2019/0288688 A1* | 9/2019 | Gribok | H03K 19/017581 |
| 2019/0363715 A1* | 11/2019 | Lee | G06F 30/34 |
| 2020/0106442 A1* | 4/2020 | Langhammer | H03K 19/1737 |

FOREIGN PATENT DOCUMENTS

CA 2179758 C 6/1995

OTHER PUBLICATIONS

Haraszti, CMOS Memory Circuits, 2000, 2001, pp. 323-328, Kluwer Academic Publishers, U.S.A., The Netherlands.
Luecke, Semiconductor Memory Design and Application, 1973, pp. 141-153, McGraw-Hill Book Company, U.S.A.
U.S. Appl. No. 16/350,112, unpublished, Haraszti.

* cited by examiner

*Primary Examiner* — Don P Le (57) ABSTRACT

Method for creating gates and circuits for computing apparatus with greatly improved characteristics of size, weight, power consumption, reliability, environmental tolerance, radiation hardness, and operational speed at reduced costs by using symbol transformer, is provided. The symbol transformer having at least a first multiplicity of symbol ports coupled to a first variety of symbols, and a second multiplicity of symbol ports coupled to a second variety of symbols, associates an arbitrary one or plurality of the first multiplicity of symbol ports to and with any one or any plurality of the second or other multiplicities of symbol ports. The symbols represent static, dynamic, or both type of variables, and are used to operations of reversible, irreversible, randomized and quantum gates, circuits, and apparatus. Examples of code-controlled symbol transformer circuits embodiments demonstrate amenability for down scaling and manufacturing in silicon and other main-line processings.

27 Claims, 9 Drawing Sheets

METHOD FOR CREATING GATES AND CIRCUITS FOR GREATLY IMPROVED COMPUTING APPARATUS BY USING SYMBOL TRANSFORMER

CROSS-REFERENCE TO RELATED APPLICATIONS

This application is related to patent application Ser. No. 16/350,112 and PCT/US2018/00378, filed on Sep. 26, 2018, by the present inventor.

FEDERALLY SPONSORED RESEARCH OR DEVELOPMENT

None

SEQUENCE LISTING

None

SMALL BUSINESS OR MICRO ENTITY

Yes

BACKGROUND/PRIOR ART

The great evolutionary improvement in the characteristics of size, weight, power consumption, reliability, environmental tolerance, radiation hardness, and operational speed of computing apparatus have been results of steady downscaling in feature sizes of semiconductor transistors and interconnects—in alignment of the Moore's Law. This evolutionary downscaling, however, has approached its fundamental limits introduced by physical phenomena.

To circumvent those limitations, quantum computation has emerged to be the most promising approach to achieve super fast computational performance. Yet, state-of-the-art quantum computers are unscalable and of huge size and heavy weight. They dissipate tremendous amount of power, operate unreliability, sensitive to radioactive radiation, work in small temperature range, mostly at extremely low temperature. Furthermore, their overall operation speeds are much slower than expected, mainly because of the use of traditional elements, among others high-capacity memory devices, which support and complement the operations of quantum circuits and apparatus.

No patent, patent application, nor publication has been found that proposes a method for creating improved computing apparatus, including but not limited to reversible, randomized, and quantum gates, circuits, and systems, which use symbol transformer; and no patent, patent application, nor publication has been found that proposes a method for creating memory, including but not limited to random access, serial, content addressable, read-write, programmable, read only memory circuits and apparatus, which use code-controlled symbol transformer for simultaneously improving said characteristics at low cost.

Table 1 is a tabulation of some prior art patent applications and patents which may appear relevant.

TABLE 1

| Number | Kind Code | Priority Date | Patentee |
| --- | --- | --- | --- |
| U.S. 16/350,112 | A1 | Sep. 30, 2017 | Haraszti |
| U.S. 2018/00378 | A1 | Sep. 30, 2017 | Haraszti |

TABLE 1-continued

| Number | Kind Code | Priority Date | Patentee |
| --- | --- | --- | --- |
| U.S. 784 7615 | B2 | Sep. 5, 2006 | Yoruzu |
| CA 217 9758 | C | Dec. 22, 1993 | Dohesh |
| U.S. 481 1400 | A | Dec. 24, 1984 | Fisher |

U.S. Ser. No. 16/350,112, and US 2018/00378, applied by the inventor of the present application, describes and claims a method of using symbol transformer machine for performing information storage and memory functions, and introduces a number of embodiments for symbol transformer machines. U.S. Pat. No. 7,847,615 proposes a quantum computing circuit that forms a superconductive loop, including a plurality of Josephson junction, first and second superconductive magnetic flux quantum element. CA 217 9758 presents a method and apparatus for performing fast Hadamard transform to optimize the use of memory resources in data processing systems. U.S. Pat. No. 4,811,400 offers a method of transforming text data to symbolic speech data for text-to-speech word processing and cryptographic uses.

SUMMARY

A method of using a symbol transformer machine for creating gates and circuits for computing apparatus with greatly improved characteristics of size, weight, power consumption, reliability, environmental tolerance, radiation hardness, downscaling, manufacturability and costs, is provided. It transubstantiates the symbol transformer into computing gate, circuit, and apparatus. Exemplary embodiments are introduced.

Advantages of the Invention

The new use of symbol transformer and new symbol transformer greatly improves individual and combinative characteristics of size, weight, overall operational speed, power consumption, reliability, environmental tolerance, radiation hardness, manufacturability and costs, of reversible, randomized and quantum computing apparatus. Such improvements were thought impossible, because the semiconductor manufacturing technology has nearly achieved its limitations in feature sizes and said characteristics.

The invention massively reduces the number of constituent elements and complexity. In turn, it allows for manufacturing very complex systems at low costs integrated in a single chip comprising all the necessary computing and memory circuits. Such degree of integration was believed impossible.

The invention allows to integrate and manufacture quantum or quantum-like computers on a single or a few chips mass-produced in mainline processing technologies. Such integration and production were thought impossible.

The invention eliminates quantum computers' need of unscalable giant supporting apparatus including but not limited to cooling, mechanic and other auxiliary ones. Such elimination and reduction in size and weight was thought impossible.

The invention circumvents the limitations and trade-offs inherent in mainline processing technologies by circuit rather than process technological innovations, and by creating circuits amenable to produce by available manufacturing processes.

The invention provides operational characteristics which are unachievable with prior art, satisfies long-existing needs in and computing technology, and offers great advancements in the art.

FIGURES—DRAWINGS

FIG. 1 illustrates FIG. 1A the generic symbol transformer, and FIG. 1B an exemplary embodiment of the generic symbol transformer in a cross-point array.

FIG. 3 illustrates the operation of FIG. 3A associating symbols, and FIG. 3B providing associated symbols.

FIG. 8 illustrates one of the symbol selector means embodied in rectangular type of FIG. 8A NAND, FIG. 8B NOR and FIG. 8C complementary decoder circuits.

DESCRIPTION

Figure 1A:
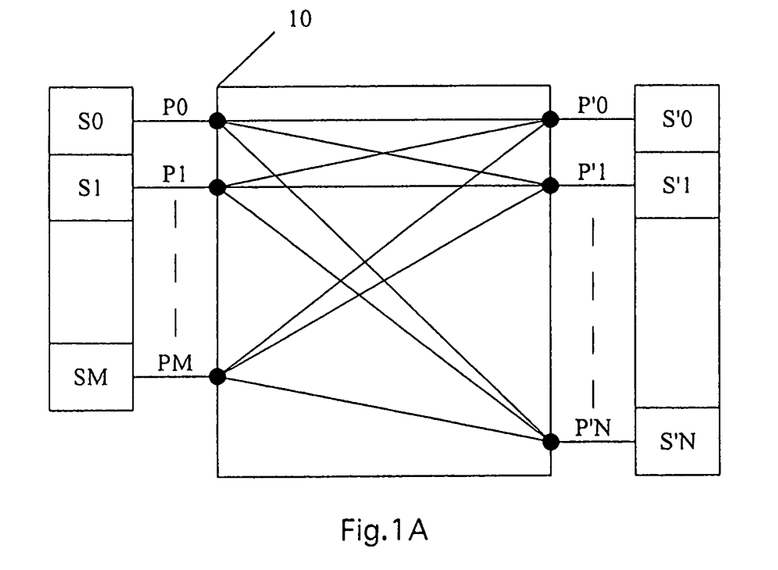
Figure 1B:
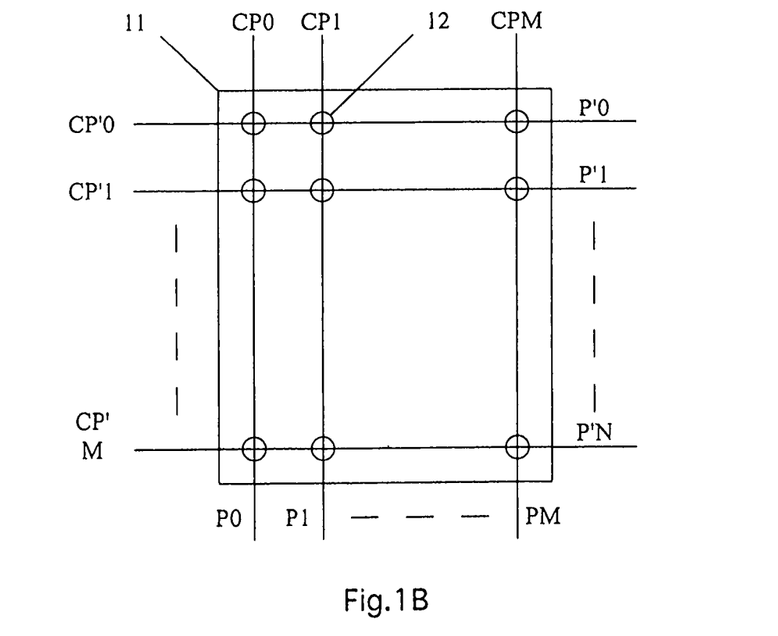

FIG. 1 includes a block diagram of FIG. 1A the generic symbol transformer, and FIG. 1B an exemplary embodiment of the generic symbol transformer, for presentment of the method to create gates and circuits with greatly improved computing apparatus by using symbol transformers.

The method for creating computing gates, circuits, and apparatus uses one or a plurality of generic symbol transformer 10. The use of symbol transformer 10 greatly improves the characteristics of size, weight, power consumption, reliability, environmental tolerance, radiation hardness, and costs; and allows to down-scale and mass-manufacture reversible, randomized, and quantum computing apparatus.

A symbol represents one or a plurality of things or functions.

Generic symbol transformer 10 associates a first one or a plurality of ports P0, P1, . . . PM coupled to a first variety of symbols S0, S1, . . . SM to and with a second one or a plurality of ports P'0, P'1, . . . P'N coupled to and with a second variety of symbols S'0, S'1, . . . S'N.

The association of ports represents a transformation between and among symbols. The transformation allows selection of any number of symbols from any number of symbols and from any number of sets of symbols, and associate those to and with any number of symbols selected from any number symbols and from any number of sets of symbols.

Most of the complex symbol transformations are reducible to a combination of associations of one port selected from a first multiplicity of ports P0, P1, . . . PM to and with another one port selected from a second multiplicity of ports P'0, P'1, . . . P'N.

Generic symbol transformer 10 is inherently amenable for performing computing and memory functions. Yet, to associate one out of M number of symbols to and with one out of N number of other symbols, the apparatus needs M×N memory elements.

For embodiment of generic symbol transformer 10, the well-known cross point array 11 is used as an example to associate one out of M ports and symbols to and with one out of N ports and symbols cross-point array 11 comprises a plurality of first conveyor line means CP0, CP1, . . . CPM for conveying binary signals from and to ports P0, P1, . . . PM;

a plurality of second conveyor line means CP'0, CP'1, . . . CP'N for conveying binary signals to and from ports P'0, P'1, . . . PN;

a plurality M×N of memory element means 12, each coupled to and with one of the plurality of first conveyor line means CP0, CP1, . . . CPM and to one of the plurality of second conveyor line means CP'0, CP' 1, . . . CP'N, at or about a cross point of the conveyor line means, for providing programmable or writable, or fixed storage of conveyance and nonconveyance states.

Memory element means 12 are having two terminals, for programming or writing by using a certain amount of energy, that changes conveyance to nonconveyance state, or vice versa, and stores the particular state. The programming or writing may be fixed during fabrication or by design.

Generic symbol transformer 10 may apply static symbols, which represent static variables having certain values, or dynamic symbols representing random variables taking values randomly and probabilistically from a certain choice of real numbers, or a combination of said static and dynamic symbols. Whereby the method allows for creating reversible, irreversible, randomized and quantum gates, circuits and apparatus, and for greatly improving said characteristics.

A first use of generic symbol transformer 10, wherein a first variety of symbols S0, S1, . . . SM are input variables and values, and a second variety of symbols S'0, S'1, . . . S'N are output variables and values for mathematical and other operations or functions, is for creating computing apparatus with greatly improved and characteristics.

A second use of generic symbol transformer 10, wherein the varieties of said symbols comprise one or a plurality of static symbols, is to form nonreversible gates and circuits for creating reversible, randomized and quantum computing apparatus with greatly improved said characteristics.

A third use of generic symbol transformer 10, wherein the varieties of symbols comprise one or a plurality of dynamic symbols changing their occurrence probabilities between the values of false or zero and true or one, is to form randomizing gates and circuits for creating randomized and quantum computing apparatus with greatly improved said characteristics.

A fourth use of generic symbol transformer 10, wherein the varieties of said symbols comprise one or a plurality of said dynamic symbols having arbitrary amplitudes and changing their occurrence amplitudes probabilities among positive true or one, false or zero, negative true or negative one values, is to form quantum gates and circuits for creating quantum computing apparatus with greatly improved said characteristics.

A fifth use of generic symbol transformer 10, wherein first variety of symbols S0, S1, . . . SM are content symbols representing content information, and a second variety of symbols S'0, S'1, . . . S'N are address symbols representing addresses for content symbols, is for creating information storage and memory apparatus by storing the association between and among a plurality of content information and addresses greatly improved said characteristics.

A sixth use of general symbol transformer 10, wherein symbol transformer 10 is a reversible memory apparatus, is for allowing memory access either by content symbol or by address symbol. Whereby said characteristics of data storage and memory apparatus greatly improve.

A seventh use of generic symbol transformer, wherein a plurality of symbols representing a variety of input information produce output information associated with one or a plurality of said input information, is for creating artificially intelligent apparatus with greatly improved said characteristics.

An eighth use of generic symbol transformer 10, wherein the multiplicities of symbol ports represent dendrites, and the associations between and among the dendrites represent axons, is for creating neurons and neural networks, with greatly improved said characteristics.

Figure 2:
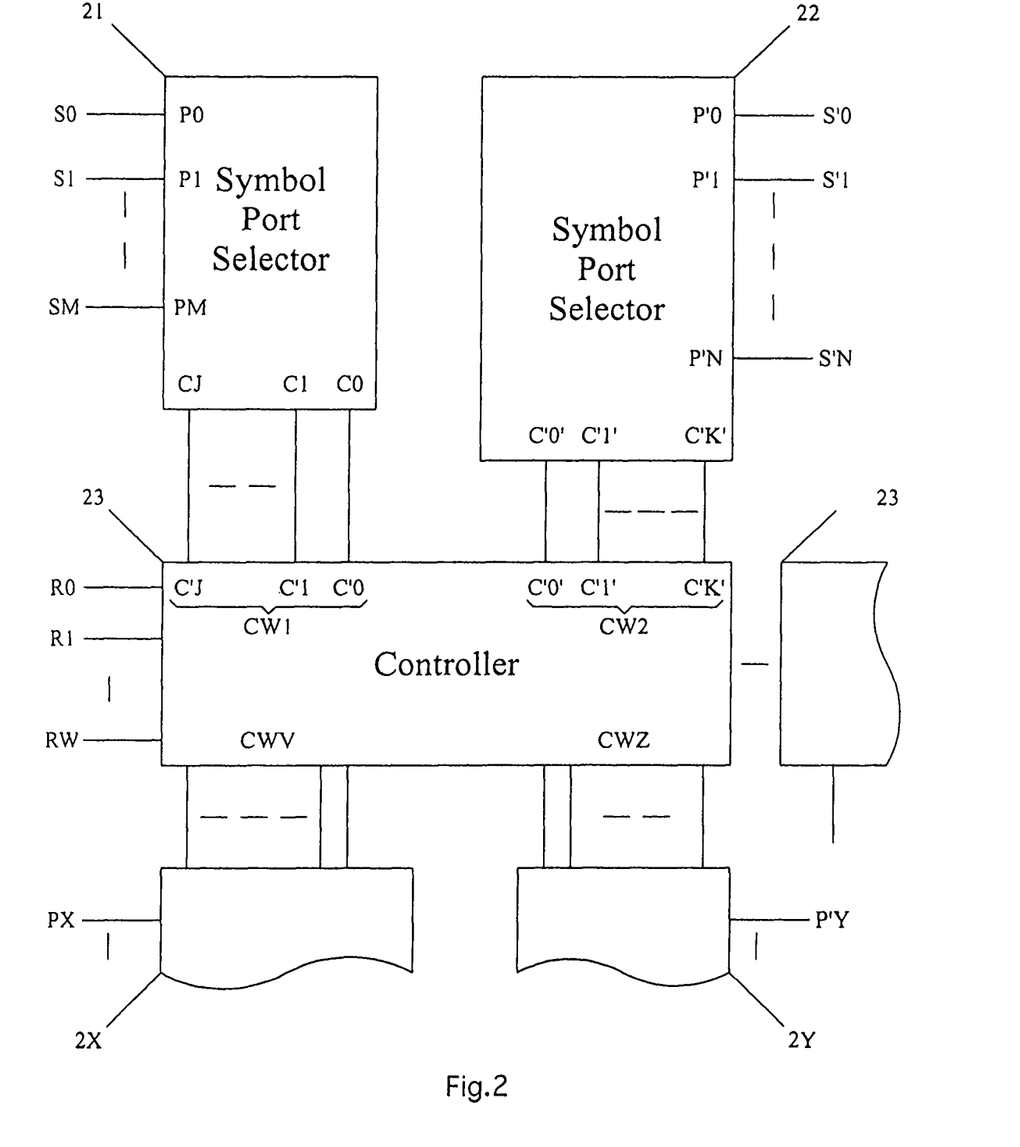
FIG. 2 illustrates the generic symbol transformer embodied in code-controlled symbol transformer circuit.

FIG. 2 illustrates an embodiment of the generic symbol transformer in code-controlled symbol transformer circuit configured for creating further greatly improved computing apparatus.

The code-controlled multi-port symbol transformer circuit associates one or a plurality of ports P0, P1, . . . PM to and with another one or a plurality of ports selected from another multiplicity of ports P' 1, . . . P'N. Each port is coupled to one or a plurality of symbols. It allows for associating any port to and port, any number of ports to any number of ports, any symbol to any symbol, and any number of symbols to any number of symbols.

The code-controlled symbol transformer circuit further greatly reduces the number of elements and complexity. It associates one out of M number of symbols to and with another one out of N number of other symbols, it needs only MlogM+NlogN number, or 2NlogN number (if M=N) of coupling elements in a symbol array, rather than M×N or $N^2$ elements in a large array as the generic symbol transformer does.

The code-controlled symbol transformer circuit comprises
one or a plurality of first symbol port selector means 21, having a plurality of first control inputs C0, C1, . . . CJ, and a first multiplicity of symbol ports P0, P1, . . . PM coupled to and with first variety of symbols S0, S1, . . . SM, for receiving control code-words CW1 and selecting one or a plurality out of first multiplicity of symbol ports P0, P1, . . . PM;
one or a plurality of second symbol port selector means 22 having a plurality of second control inputs C'0, C'1, . . . C'N, and second multiplicity of symbol ports P'0, P'1, . . . P'N coupled to and with second variety of symbols S'0, S'1, . . . S'N, for receiving control code-word CW2 and selecting one or a plurality out of second multiplicity of symbol ports P'0, P'1, . . . P'N;
one or a plurality of controller means 23, having a plurality of regulator inputs R0, R1, . . . RN, a plurality of first control outputs C0', C1', . . . Cr coupled to and with first control inputs C0, C1, . . . CJ of first symbol port selector means 21, and a plurality of second control outputs C'0', C'1', . . . C'K' coupled to and with second control inputs C'0, C'1, . . . C'K of second control selector means 22, for receiving, associating, storing, and providing control code-words.

Symbol transformer circuit 10, further comprising any number and any size of symbol port selector means 21, 22, 2X, 2Y, for receiving and providing any number of any code-words CW1, CW2, CWV, CWZ, and for selecting any one or a plurality of any number of ports P0, P1, . . . PM, P'0, P'1, . . . P'M, PX, P'Y, associates any number of symbols to and with any number of symbols. Whereby the application area of the circuit extends.

Symbol transformer circuit 10, wherein the number of ports for each and all symbol selector means 21, 22, 2X, 2Y are the same, reduces the complexity of circuit 13. Whereby said characteristics further improve.

Symbol transformer circuit 10 embodied in one or a plurality of transistor circuit technologies, including but not limited to MOS, CMOS, SOI, Bipolar, Gallium-Arsenide, Ferroelectric, Magnetic, Optic, Carbon, Mechanical, Molecular, Atomic, Subatomic ones, further greatly improves manufacturability and said characteristics.

Symbol transformer circuit 10, wherein one or a plurality of symbol port selector means 21, 22, 2X, 2Y are embodied in one or a plurality of transcoders, including but not limited to tree type and rectangular type of decoders and encoders, further greatly improves manufacturability and said characteristics.

Symbol transformer circuit 10, wherein one or a plurality on control means 23 are code-word generators; including but not limited to counter, shift register, compute and data process or circuits and apparatus, eases design effort and manufacturability.

Symbol transformer circuit 13, wherein one or a plurality of symbol and selector means 21, 22, 2X, 2Y and controller means 23 are embodied in one or a plurality of memories, including but not limited for programmable, read-write, read only, and content addressable memories, further greatly improves manufacturability and said characteristics.

Figure 3A:
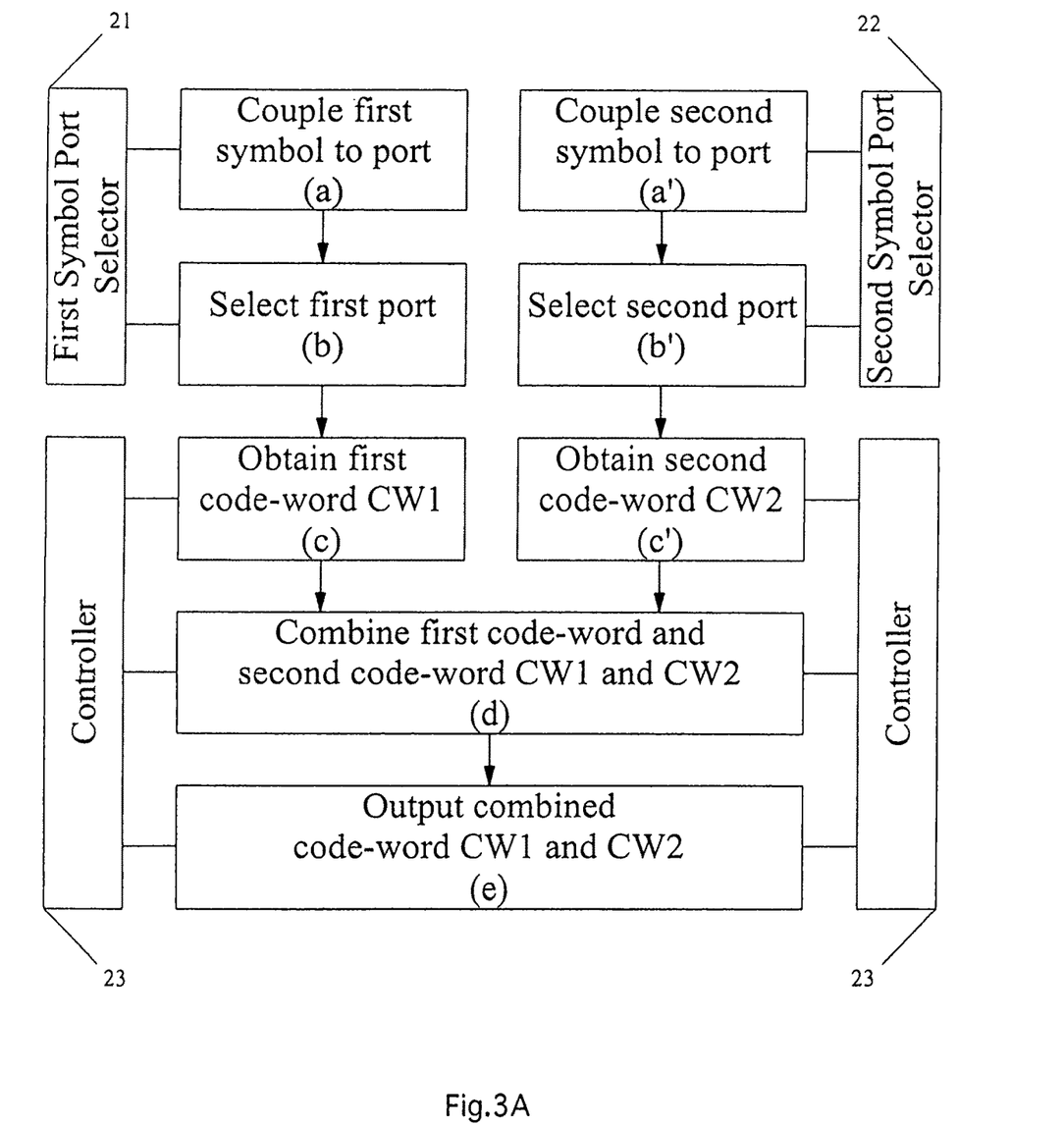
Figure 3B:
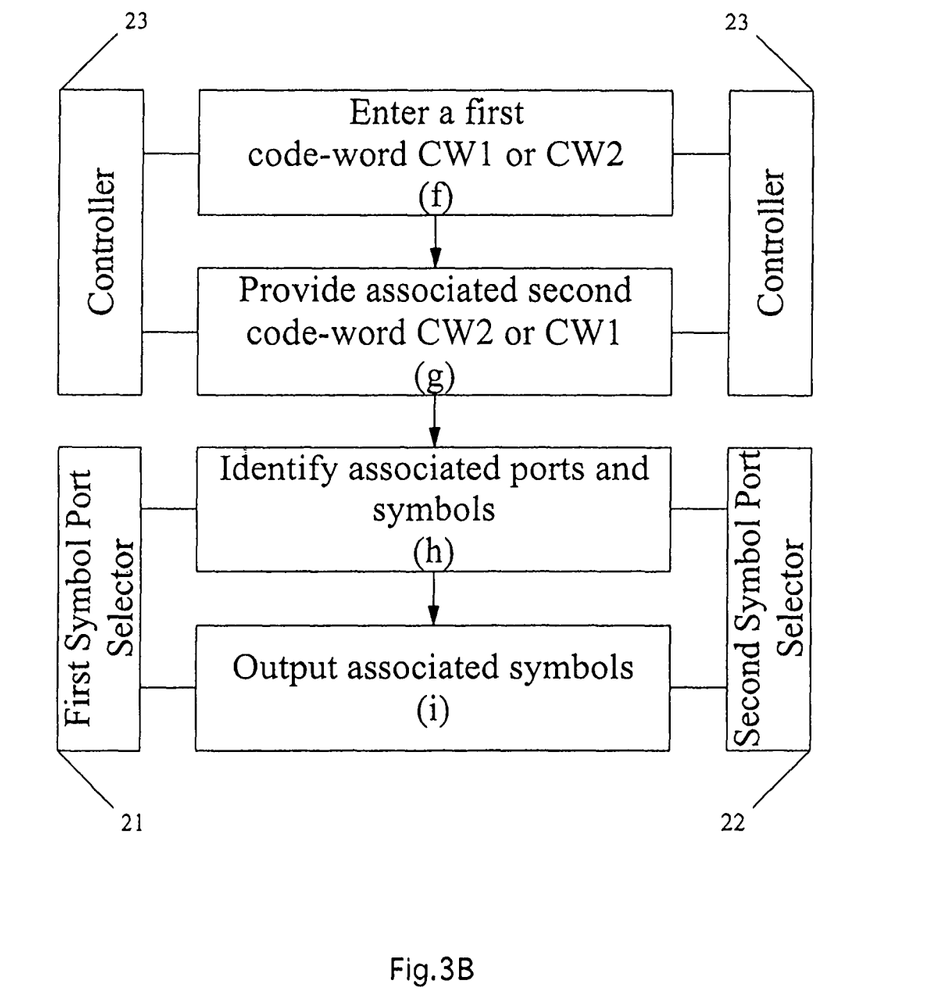

FIG. 3 includes two flow charts illustrating operations of FIG. 3A associating one or a plurality of symbols to and with one or a plurality of other symbols, and FIG. 3B providing associated symbols using symbol transformer circuit.

Associating symbols comprises the steps of
(a) couple first variety of symbols S0, S1, . . . SM to and with first multiplicity of symbol ports P0, P1, . . . PM of first symbol port selector means 21;
(a') couple second variety of symbols S'0, S'1, . . . S'N to and with second multiplicity of symbol ports P'0, P'1, . . . P'N of second symbol port selector means 22;
(b) select a first port with a first symbol from first multiplicity of symbol ports P0, P1, . . . PM in first symbol selector means 21;
(b') select a second port with a second symbol from second multiplicity of symbol ports P'0, P' 1, . . . P'N in second symbol port selector means 22;
(c) obtain first code-word CW1 for addressing the selected first port in first symbol port selector means 21;
(c') obtain second code-word CW2 for addressing the selected second port in second symbol port selector means 22;
(d) combine code-word CW1 with code-word CW2, and store the combination of code-word CW1 and code-word CW2 in controller means 23;
(e) output the combination of code-word CW1 and code-word CW2.

Providing associated symbols comprises the steps of
(f) enter first code-word CW1 or second code-word CW2;
(g) provide second code-word CW2 associated with first code-word CW1, or vice versa;
(h) identify a plurality of ports and symbols selected by the combination of first code-word CW1 and second code-word CW2 from the first and second multiplicities of symbol ports P0, P1, . . . PM and P'0, P'1, . . . P'N, and from first and second varieties of symbols S0, S1, . . . SM and S'0, S'1, . . . S'N;
(i) output the associated symbols selected from first variety of symbols S0, S1, . . . SM and second variety of symbols S'0, S'1, . . . S'N.

Figure 4:
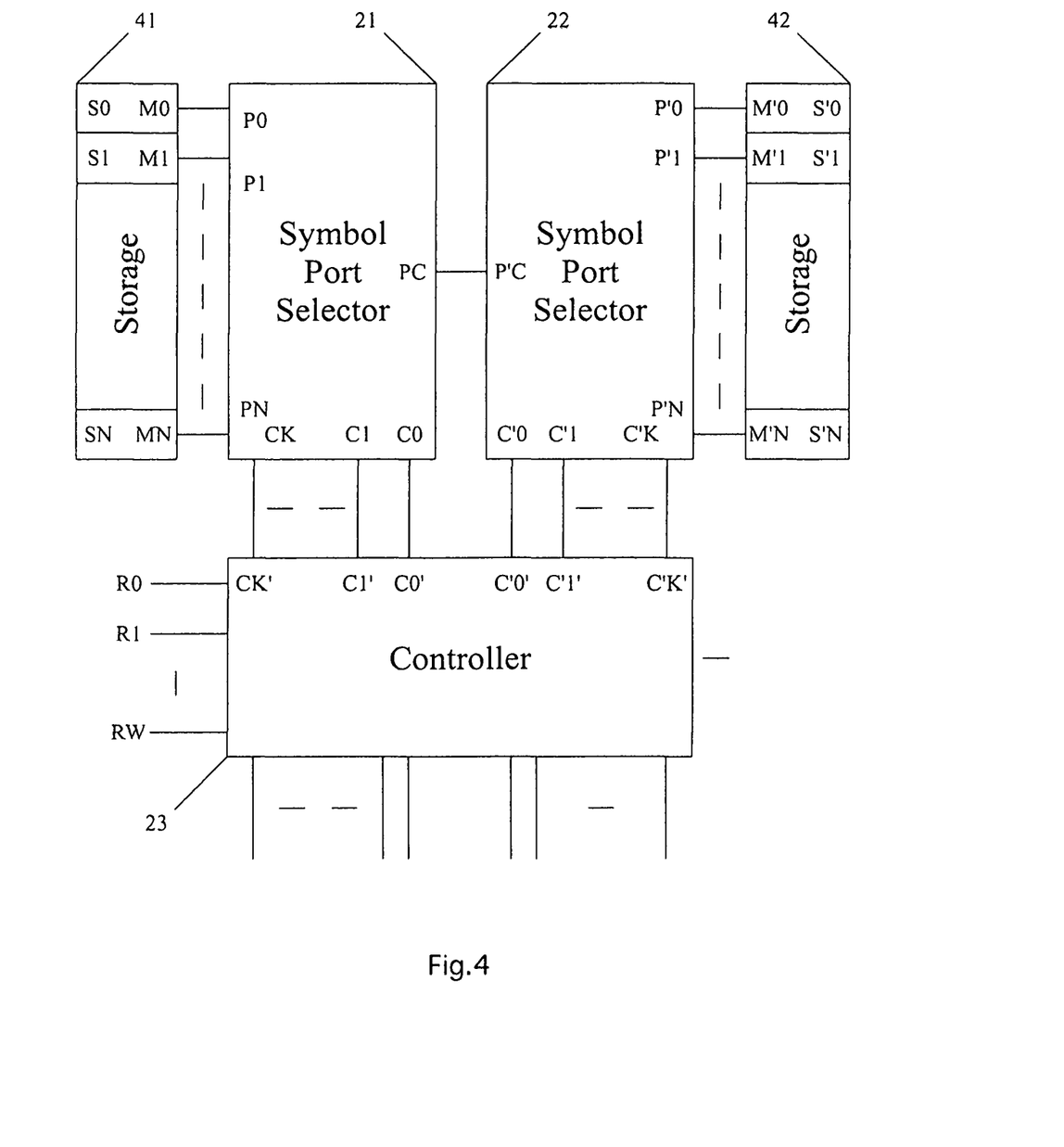
FIG. 4 illustrates a symmetric code-controlled symbol transformer augmented with a central coupling and symbol storage.

FIG. 4 is a schematic diagram illustrating an exemplary symmetric code-controlled symbol transformer augmented with a central coupling and symbol storage.

Symbol transformer circuit 10, embodied in a symmetric circuit, having the same number of symbol ports P0, P1, . . . PN; P'0, P'1, . . . P'N and of control bits C0, C1, . . . CK; C'0, C'1, . . . C'K; C0', C1', . . . CK'; C'0', C1', . . . C'K', for the plurality symbol selector means 21, 22 and controller means 23, respectively, simplifies operation and reduces complexity. Whereby said characteristics further improve.

Symbol transformer circuit 10, wherein each of the plurality symbol selector means 21, 22 has at least one central port PC, P'C, for coupling central port PC to and with at least another central port P'C allows for providing direct coupling between and among selected ports and symbols. Whereby the application area of circuit 10 extends.

Symbol transformer circuitry 10, further comprising one or a plurality of symbol storage means 41, 42, each having a multiplicity of symbol outputs M0, M1, . . . MN; M'0, M'1, . . . M'N, coupled to and with multiplicities of symbol ports P0, P1, . . . PN; P'0, P'1, . . . P'N; and symbols S0, S1, . . . SN; S'0, S'1, . . . S'N in close proximity to symbol port selector means. Whereby speed and power performance of computing and memory circuits and apparatus further improve.

Figure 5:
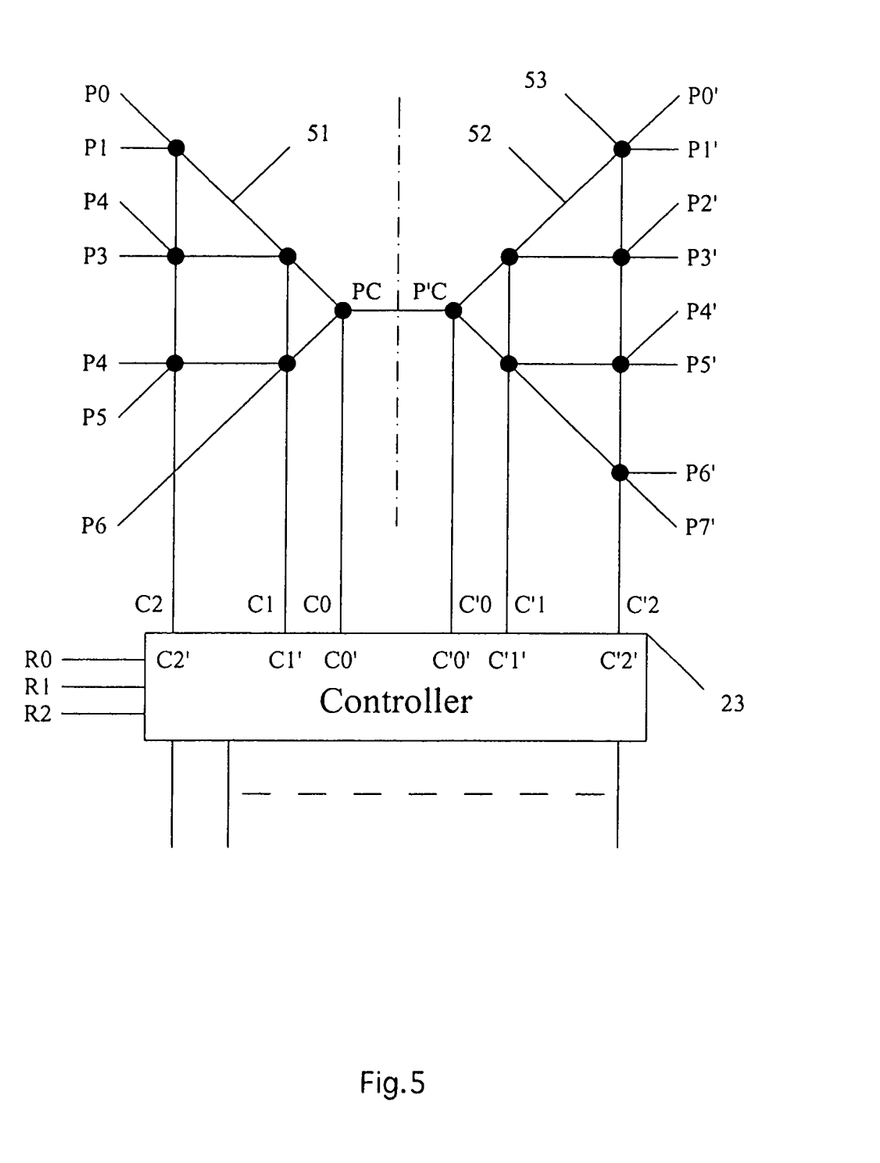
FIG. 5 illustrates the code-controlled symbol transformer circuit embodied in tree-type of transcoders.

FIG. 5 illustrates the schematic of an embodiment of the code-controlled symbol transformer circuit, wherein the symbol port selector means are tree type of transcoders, for further improving speed and power properties.

The illustrated embodiment of symbol transformer circuitry 10, wherein a well known tree type of transcoders are tree type of decoders, in centered dual configuration, comprises a first tree type decoder 51, having a plurality of first control inputs C0, C1, C2; a first multiplicity of symbol ports P0, P1, . . . P6, and a first central port PC; formed to a circuit tree by using a plurality of controlled switches 53 at branch points;

a second tree type of decoder 52, having a plurality of second control inputs C'0, C'1, C'2, a second multiplicity of symbol ports P0', P1', . . . P7', and a second central port P'C coupled to and with first central port PC, formed to a circuit tree by using a plurality of controlled switches 53 at branch points, controller 23, having a plurality of regulator inputs R0, R1, R2, a plurality of first control outputs C0', C1', C2' coupled to and with inputs C0, C1, C2 of decoder 51, and a plurality of second control outputs C'0', C' 1, C'2' coupled to and with inputs C'0, C'1, C'2 of decoder 52.

Controlled switches 53, for providing couplings between an input and one or a plurality of outputs, depending on the control information received on control inputs C0, C1, C2; C'0, C'1, C'2 from respective outputs C0', C1', C2'; C'0', C'1', C'2' of controller 23, further improve said characteristic.

Figure 6:
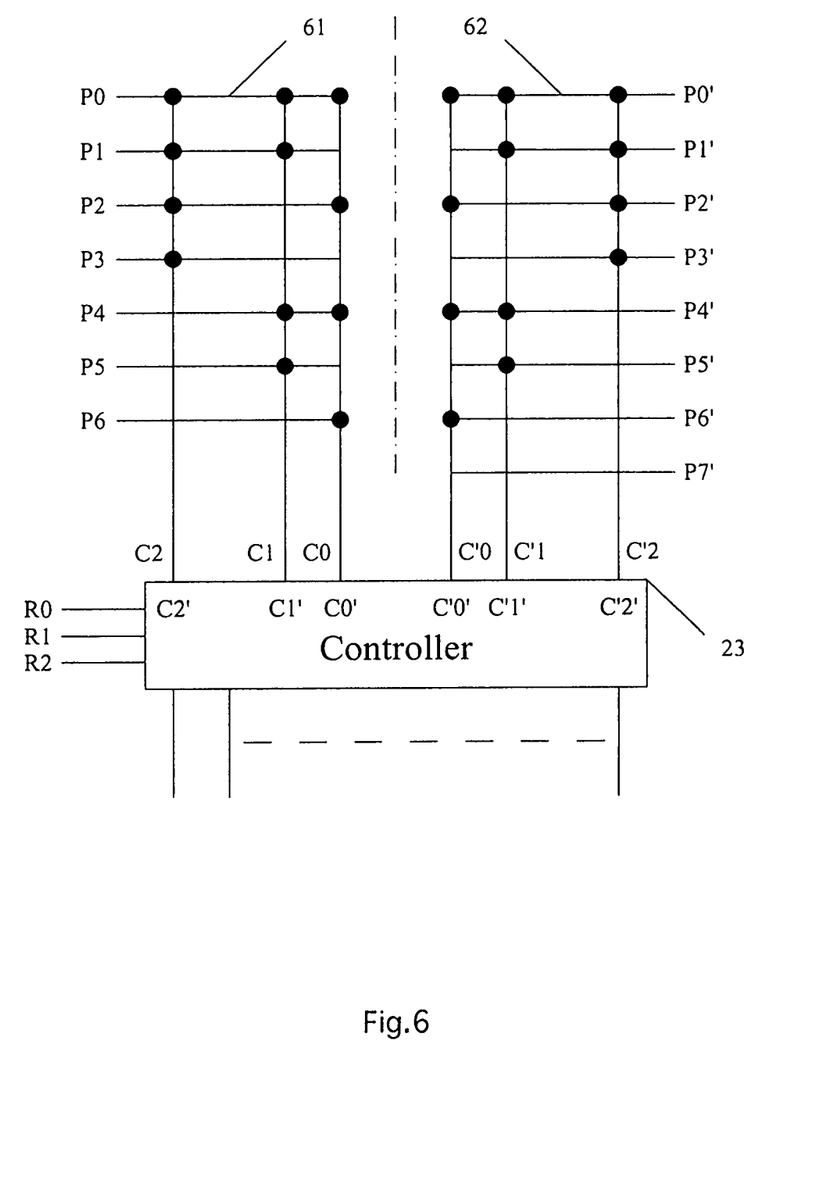
FIG. 6 illustrates the code-controlled symbol transformer circuit embodied in rectangular type of transcoders.

FIG. 6 illustrates the schematic of another embodiment of the code-controlled port symbol transformer circuitry wherein the symbol port selector means are rectangular type of transcoders, for further improving said speed and power properties.

The illustrated embodiment of symbol transformer circuitry 10, wherein the well known rectangular type of transcoders 61 and 62 are rectangular type of decoders formed in the centered dual configuration shown in FIG. 5.

Figure 7:
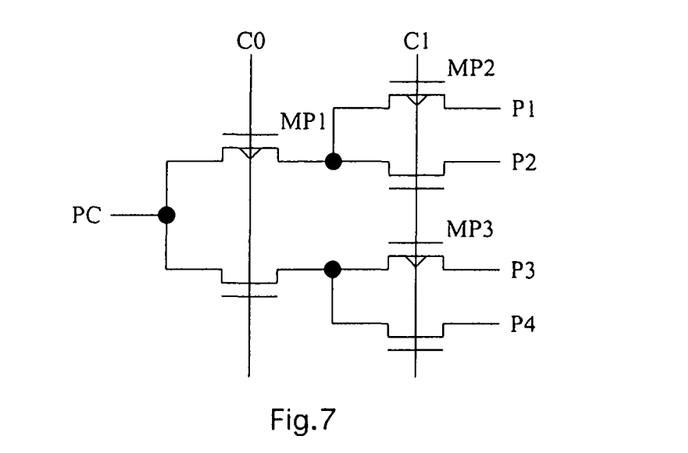
FIG. 7 illustrates one of the symbol selector means embodied in a tree-type of CMOS decoder circuit.

FIG. 7 illustrates one of symbol selector means 21, 22 embodied in a tree type of CMOS decoder circuit, for further improving said speed and power properties.

In the well known tree type of CMOS decoder circuit, transistors marked MP1, MP2, MP3 are p-channel devices, unmarked transistors are n-channel devices. The circuit has central terminal PC, ports P1, P2, P3, P4, and control inputs C0 and C1.

Figure 8A:
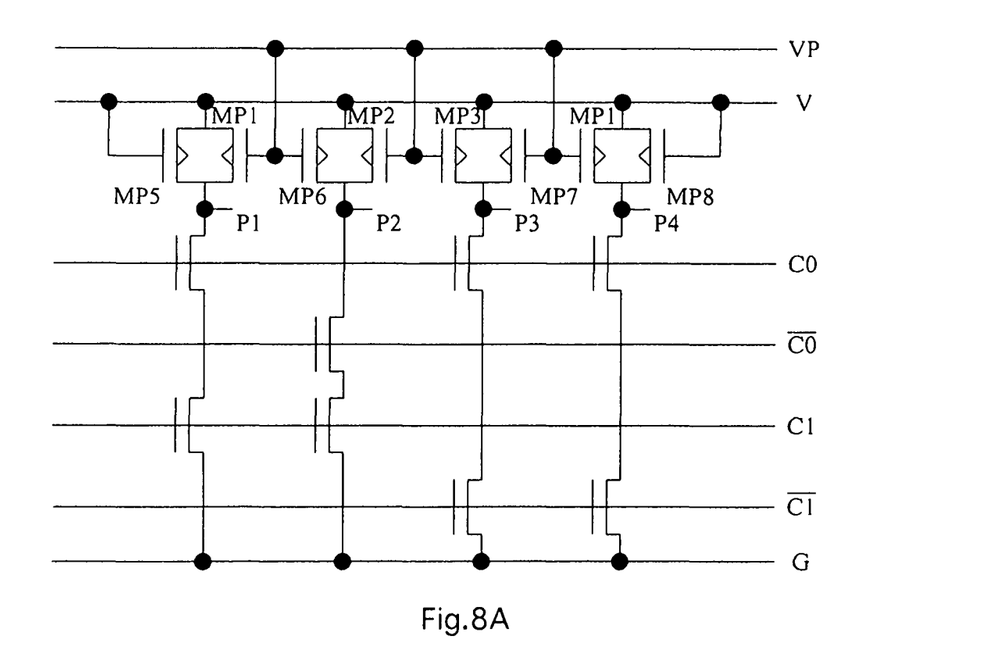
Figure 8B:
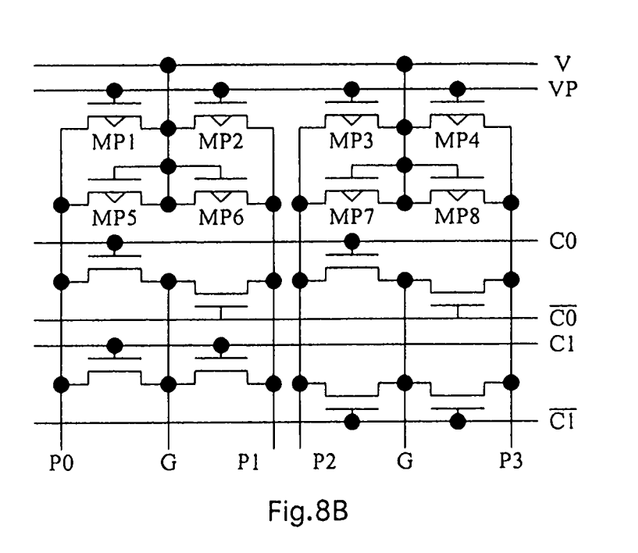
Figure 8C:
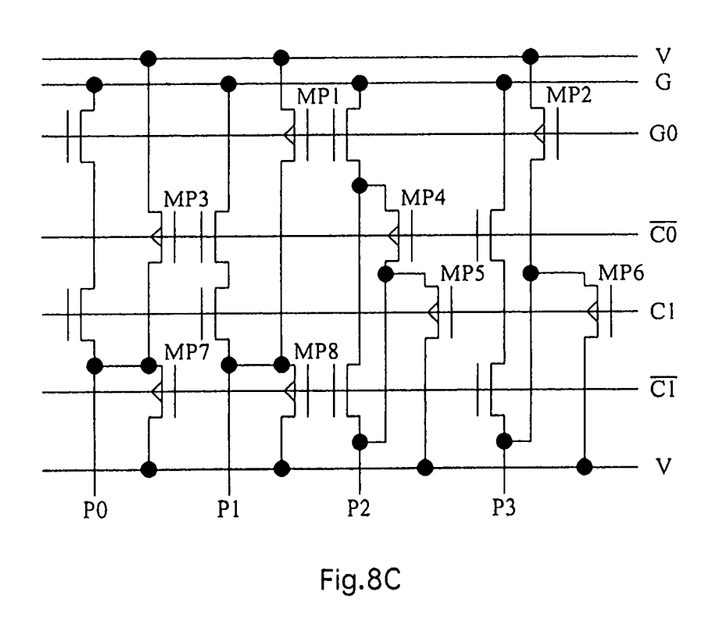

FIG. 8 illustrates one of the symbol selector means embodied in rectangular type of FIG. 8A NAND, FIG. 8B NOR and FIG. 8C full-complementary type of CMOS decoder circuits, for further improving said speed and power properties.

In the well known rectangular type of NAND, NOR and full-complimentary type of decoder circuits, transistors marked MP1, MP2, . . . M8 are p-channel devices and unmarked transistors are n-channel devices. Each and all of the circuits have ports P0, P1, P2, P3, control inputs C0, $\overline{C0}$, C1, $\overline{C1}$, voltage supply terminal V and ground terminal G. Both the NAND and full-complementary type of CMOS decoder NOR types of decoders are provided with an additional precharge voltage terminal VP.

The invention claimed is:

1. Method for creating computing gates and circuits for computing apparatus with greatly improved characteristics of size, weight, power consumption, reliability, environmental tolerance, radiation hardiness, overall operational speed and costs compared to prior art, by using one or a plurality of symbol transformers having at least a first multiplicity of symbol ports coupled to a first variety of symbols, and a second multiplicity of symbol ports coupled to a second variety of symbols, for associating arbitrarily one or a plurality of said first multiplicity of symbol ports to and with of one or a plurality of said second multiplicity of symbol port and providing associated symbols.

2. The method of claim 1, wherein said symbol transformer further comprises a plurality of multiplicities of symbol ports coupled to corresponding multiplicities of symbols, whereby the application area of said symbol transformer extends to associations between and among more than two varieties of symbols.

3. The method of claim 1, wherein said symbol transformer provides associations in couplings and transformation between and among any number of symbol ports, whereby the application area of symbol transformer extends to associations of symbols for one with one, one with a plurality, a plurality with the same plurality, and/or plurality with differing plurality port couplings.

4. The method of claim 1, wherein said symbols are static symbols representing static variables having certain values, or dynamic symbols representing random variables taking values randomly and probabilistically from a certain choice of numbers, or a combination of said static and said dynamic symbols, for forming reversible, irreversible, randomized, and quantum gates, circuits, memories, and apparatus, and for greatly improving said characteristics.

5. The method of claim 1, wherein said first variety of symbols are input variables and values for said input variables, and said second variety of symbols are output variables and values for said output variables, to mathematical or other operations and functions, for creating gates and circuits for computing apparatus with greatly improved said characteristics, compared to prior art.

6. The method of claim 1, wherein the varieties of said symbols comprise one or a plurality of said static symbols for forming reversible gates and circuits to reversible, randomized, and quantum computing apparatus with greatly improved said characteristics, compared to prior art.

7. The method of claim 1, wherein the varieties of said symbols comprise one or a plurality of said dynamic symbols changing their occurrence probabilities between the values of zero and one, for forming randomizing gates and circuits to randomized and quantum computing apparatus with greatly improved said characteristics, compared to prior art.

8. The method of claim 1, wherein the varieties of said symbols comprise one or a plurality of said dynamic symbols changing their occurrence amplitudes between positive and negative values, for forming quantum gates and circuits for to quantum computing apparatus with greatly improved said characteristics compared to prior art.

9. The method of claim 1, wherein said first multiplicity of symbols are content symbols representing content information, and said second multiplicity of symbols are address symbols representing addresses for said content symbols, for creating information storage and memory apparatus by storing associations between and among said content symbols and said address symbols, whereby said characteristics of data storage and memory apparatus greatly improve, compared to prior art.

10. The method of claim 1; wherein said symbol transformer is a reversible apparatus for allowing access either by said content symbol or by said address symbol, whereby said characteristics of said data storage and memory apparatus greatly improve.

11. The method of claim 1, wherein one or a plurality of symbols representing a variety of input information produce output information associated with one or a plurality of said input information for creating artificial intelligence, whereby said characteristics of artificially intelligent apparatus greatly improve, compared to prior art.

12. The method of claim 1, wherein said multiplicities of symbol ports represents dendrites, and said associations between and among said dendrites represent axons, for creating artificial neurons and neural networks, whereby said characteristics of neural and artificially intelligent apparatus greatly improve, compared to prior art.

13. The method of claim 1, wherein said symbol transformer is embodied in code-controlled symbol transformer circuit configured further for greatly reducing the number of elements of said computing apparatus, whereby said characteristics further greatly improve, comprising one or a plurality of first symbol port selector means, having a plurality of first control inputs and a first multiplicity of symbol ports coupled to a first variety of symbols for receiving control code-words and selecting one or a plurality out of said first multiplicity of symbol ports;

one or a plurality of second symbol port selector means having a plurality of second control inputs and a second multiplicity of symbol ports coupled to a second variety of symbols, for receiving control code-words and selecting one or a plurality out of said multiplicity of symbol ports;

one or a plurality of controller means having a plurality of regulator inputs, a plurality of first control outputs coupled to said first control inputs of said first symbol port selection means;

and a plurality of second control outputs coupled to said second control inputs of said second control selector means, for receiving, associating, storing, and providing control code-words.

14. The method of claim 1, wherein said symbol transformer circuit is embodied in one or a plurality of technologies, including but not limited to MOS, CMOS, SOT, Bipolar, Gallium-Arsenide, Ferroelectric, Optical, Mechanic, Carbon, Molecular, Atomic and Subatomic technologies, for further greatly improving manufacturability and said characteristics.

15. The method of claim 1, wherein one or a plurality of said symbol port selector means are embodied in one or a plurality of transcoders, including but not limited to tree type and rectangular type of decoders and encoders, for further greatly improving manufacturability and said characteristics.

16. The method of claim 1; wherein one or a plurality of said controller means are code-word generators, including but not limited to counter, shift register oscillator, computing and data processor circuits and apparatus, for easing design and manufacturing.

17. The method of claim 1, wherein one or a plurality of said symbol transformer means and said controller means are embodied in one or a plurality of memories, including but not limited to programmable, read-write, read-only, and content addressable memories, for further improving manufacturability and said characteristics.

18. The method of claim 1, wherein the operation of associating one or a plurality of symbols comprising the steps of
(a) coupling said first variety of symbols to and with said first multiplicity of first symbol ports of said first symbol port selector means;
(a') coupling said second variety of symbols to and with said second multiplicity of symbol ports of said second symbol port selector means;
(b) selecting a first port with a first symbol from said first multiplicity of symbol ports in said first port selector means;
(b') selecting a second port with a second symbol from said second multiplicity of symbol ports in second port selector means;
(c) obtaining a first code-word for addressing said first port in said first symbol port selector means;
(c') obtaining a second code-word for addressing said second port in said second symbol port selector means;
(d) combining said first code-word with said second code-word and storing the combination of said first code word and said second code word in said controller means;
(e) outputting and combination of said first symbol and said second symbol.

19. The method of claim 1, wherein the operation of providing associated symbols comprising the steps of
(f) entering said first code-word or said second code-word;
(g) providing said second code-word associated with said first code-word, or vice versa;
(h) identifying a plurality of ports and symbols selected by said combination of said first code-word and second code-word from said first multiplicities of symbol ports and said second multiplicities of symbol ports, from said first variety of symbols and of said second variety of symbols;
(i) outputting the associated symbols selected from said first variety of symbols and second variety of symbols.

20. The method of claim 1, wherein said code-controlled symbol transformer circuit is a symmetric circuit, having the same number of said symbol ports and of said control bits for the plurality of said symbol selector means and said controller means, respectively, for simplifying operation and reducing complexity, whereby said characteristics further improve.

21. The method of claim 1, wherein each of the plurality of said symbol selector means has at least one extra central port, for coupling said central port to at least another central port, for providing direct coupling between and among selected ports and symbols, whereby the application area of said circuit extends.

22. The method of claim 1, wherein said symbol transformer circuit further comprising one or a plurality of symbol storage means, each having a multiplicity of symbol outputs coupled to and with one or a pluralities of said multiplicities of symbol ports, for storing and providing said varieties of symbols in close proximity to the plurality of said symbol port selection means, whereby speed and power performance of said computing and memory circuits and apparatus further improve.

23. The method of claim 1, wherein said symbol port selector means are tree type of transcoders, including but not limited to decoders, for further improving said characteristics, comprising at least
- a first tree type of decoder, having a plurality of first control inputs; a first multiplicity of symbol ports, a first central port, for forming a first circuit tree by using a plurality of controlled switches at branch points;
- a second tree type of decoder, having a plurality of second control inputs, a second multiplicity of symbol ports, a second central port coupled to and with said first central port, for forming a second circuit tree by using a plurality of switches at branch points;
- a controller, having a plurality of regulator inputs, a plurality of first control outputs coupled to and with the inputs of said first tree type of decoder, and a plurality of second control outputs coupled to and with the inputs of said second tree type of decoder.

24. The method of claim 1, wherein each of said tree type of decoders comprising a multiplicity of controlled switches for providing coupling or decoupling between said central input and one or a plurality of outputs, for further improving said characteristics.

25. The method of claim 1, wherein one or a plurality of said symbol ports selector means are rectangular type of transcoders, including but not limited to decoders, for further improving said characteristics.

26. The method of claim 1, wherein said symbol selector means are embodied in tree-type of CMOS decoder circuit, for further improving said characteristics.

27. The method of claim 1, wherein said symbol selector means are embodied in rectangular type of CMOS decoder circuit, including but not limited to NAND, NOR, and full complementary CMOS circuits, for further improving said characteristics.

* * * * *